(12) United States Patent
Nakatani et al.

(10) Patent No.: US 7,845,229 B2
(45) Date of Patent: Dec. 7, 2010

(54) ACCELERATION SENSOR

(75) Inventors: Goro Nakatani, Kyoto (JP); Yasuhiro Fuwa, Kyoto (JP); Mizuho Okada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 493 days.

(21) Appl. No.: 11/889,289

(22) Filed: Aug. 10, 2007

(65) Prior Publication Data

US 2008/0034868 A1 Feb. 14, 2008

(30) Foreign Application Priority Data

| Aug. 11, 2006 | (JP) | ............................. 2006-219610 |
| Aug. 11, 2006 | (JP) | ............................. 2006-219611 |
| Dec. 11, 2006 | (JP) | ............................. 2006-333281 |
| Dec. 11, 2006 | (JP) | ............................. 2006-333282 |
| Dec. 28, 2006 | (JP) | ............................. 2006-355713 |

(51) Int. Cl.
*G01P 15/12* (2006.01)

(52) U.S. Cl. .................................................. 73/514.33

(58) Field of Classification Search ............... 73/514.33, 73/514.38, 514.01

See application file for complete search history.

(56) References Cited

U.S. PATENT DOCUMENTS

| 3,709,042 A | * | 1/1973 | Lee et al. .................. 73/514.13 |
| 4,129,042 A | * | 12/1978 | Rosvold ....................... 73/727 |
| 6,316,840 B1 | * | 11/2001 | Otani .......................... 257/787 |
| 7,640,807 B2 | * | 1/2010 | Tamura et al. ............ 73/514.33 |
| 2005/0095814 A1 | | 5/2005 | Zhu et al. |
| 2005/0160814 A1 | * | 7/2005 | Vaganov et al. .......... 73/514.01 |
| 2006/0081047 A1 | * | 4/2006 | Saeki ....................... 73/514.16 |

FOREIGN PATENT DOCUMENTS

| JP | 2005-161516 | | 6/2005 |
| JP | 2005-351716 | | 12/2005 |
| WO | WO2006/009194 | * | 1/2006 |

* cited by examiner

*Primary Examiner*—John E Chapman
(74) *Attorney, Agent, or Firm*—Rabin & Berdo, PC

(57) ABSTRACT

The acceleration sensor according to the present invention includes a circuit chip having a prescribed circuit built into a front surface thereof; a sensor chip bonded to the front surface of the circuit chip; and a resin package for sealing the circuit chip and the sensor chip, while the sensor chip includes: a membrane arranged to oppose to the front surface of the circuit chip and having a plurality of openings; a piezoresistor formed on a surface of the membrane opposed to the circuit chip; a support section provided on a side opposite to the circuit chip with respect to the membrane and supporting a peripheral edge portion of the membrane; and a weight section provided on the side opposite to the circuit chip with respect to the membrane and integrally held on a central portion of the membrane.

15 Claims, 8 Drawing Sheets

ACCELERATION SENSOR

BACKGROUND OF THE INVENTION

1. Field of the Invention

The present invention relates to an acceleration sensor and a semiconductor device.

2. Description of Related Art

Loading of a sensor (MEMS sensor) employing an MEMS (Micro Electro Mechanical Systems) technique on a portable telephone has recently been started, whereby the MEMS sensor draws increasing attention. An acceleration sensor for detecting the acceleration of an object is known as a typical MEMS sensor.

FIG. 10 is a sectional view schematically showing the structure of a conventional acceleration sensor.

The acceleration sensor 101 shown in FIG. 10 includes a circuit chip 104 having a circuit for calculating and correcting acceleration, a sensor chip 105 having a piezoresistor (not shown) and a weight 106 of tungsten in a cavity formed of a ceramic package 102 and a shielding plate 103.

The ceramic package 102 has a six-layer structure obtained by laminating six ceramic substrates 102A to 102F, for example. The lower three ceramic substrates 102A, 102B and 102C have rectangular shapes of the same size in plan view. The upper three ceramic substrates 102D, 102E and 102F have the same outline as the ceramic substrates 102A, 102B and 102C in plan view, and are formed with rectangular openings on each central portion. The opening of the ceramic substrate 102D laminated on the ceramic substrate 102C is smaller than that of the ceramic substrate 102E laminated on the ceramic substrate 102D. The opening of the ceramic substrate 102E is smaller than that of the ceramic substrate 102F laminated on the ceramic substrate 102E.

A plurality of pads 107 are arranged on the upper surface of the ceramic substrate 102D. The respective pads 107 are electrically connected to the circuit chip 104 and the sensor chip 105 through bonding wires 108, respectively. Wires 109 extending from the pads 107 are formed on the upper surface of the ceramic substrate 102D. The respective wires 109 are connected to an electrode 111 arranged on the lower surface of the lowermost ceramic substrate 102A through via holes 110 vertically penetrate the lower three ceramic substrates 102A, 102B and 102C.

The shielding plate 103 is bonded to the upper surface of the uppermost ceramic substrate 102F to close the opening of the ceramic substrate 102F.

The circuit chip 104 is formed of a silicon chip. The circuit chip 105 is bonded to the upper surface of the ceramic substrate 102C through silver paste, while directing the front surface of a device forming region thereof upward.

The sensor chip 105 integrally includes a membrane 112, a frame-shaped support section 113 connected to a peripheral edge portion of one surface (lower surface) of the membrane 112 and a weight fixing section 114 connected to the central portion of the one surface of the membrane 112. The piezoresistor (not shown) is formed on the other surface (upper surface) of the membrane 112. The support section 113 and the weight fixing section 114 are separated from each other by an annular groove 116 having a section in the form of an isosceles trapezoid narrowing as approaching the membrane 112.

The sensor chip 105 is supported above the circuit chip 104 by chip spacers 115 interposed between the respective corner portions of the support section 113 and the front surface of the circuit chip 104 at a prescribed interval with respect to the front surface of the circuit chip 104.

The weight 106 is fixed to the lower surface of the weight fixing section 114 with an adhesive in a state not in contact with the circuit chip 104, the support section 113 and the chip spacers 115 between the circuit chip 104 and the sensor chip 105.

When acceleration acts on the acceleration sensor 101 and the weight 106 oscillates, the membrane 112 is deformed, and stress acts on the piezoresistor provided on the membrane 112. The resistivity of the piezoresistor changes in proportion to the stress acting thereon. Therefore, the acceleration acting on the acceleration sensor 101 can be obtained on the basis of the change in the resistivity of the piezoresistor.

In the conventional acceleration sensor 101, however, the cost is disadvantageously increased due to the employment of the ceramic package 102. Further, the weight 106 is provided independently of the circuit chip 104 and the sensor chip 105, whereby the acceleration sensor 101 is hard to downsize.

Further, when the weight 106 (membrane 112) oscillates, the membrane 112 is distorted, and the distortion may propagate to the peripheral edge portion of the membrane 112 to crease the peripheral edge portion.

The sensor chip 105 is formed by etching a silicon wafer from the rear surface side (opposite to the side provided with the membrane 112). Since a thin layer portion on the front surface of the silicon wafer must be left as the membrane 112, the silicon wafer cannot be etched from the front surface side. In a step of manufacturing the conventional sensor chip 105, therefore, the silicon wafer can be etched only from the rear surface side, and a long time is required for the etching.

When a wet etching process is employed for etching the silicon wafer, the silicon wafer is etched in the direction parallel to the rear surface thereof through the so-called side etching. In order to pattern the silicon wafer into a desired shape, therefore, the shape of a mask (resist pattern) formed on the rear surface of the silicon wafer must be decided in consideration of both of the etching rate in the direction perpendicular to the rear surface of the silicon wafer and the rate of the side etching. Therefore, much labor is required for designing the mask.

Further, steps of manufacturing an MEMS sensor include a step of thinning a silicon wafer. The silicon wafer can be thinned by grinding and/or etching the silicon wafer from the rear surface side (opposite to the front surface formed with a device). At present, a silicon wafer employed for an MEMS sensor is thinned up to a thickness of about 200 μm to 400 μm in a wafer thinning step.

As shown in FIG. 11, an edge portion of a silicon wafer has a round (convexed) sectional shape. If the silicon wafer is thinned to not less than ½ of the original thickness, therefore, the sectional shape of the edge portion is sharpened, and the mechanical strength of the edge portion is extremely reduced. Consequently, the edge portion of the silicon wafer may be broken by the so-called edge chipping when the silicon wafer is handled.

SUMMARY OF THE INVENTION

A first object of the present invention is to provide an acceleration sensor and a semiconductor device reducible in cost and size, and a method of manufacturing the semiconductor device.

A second object of the present invention is to provide a semiconductor device capable of preventing the peripheral portion of a membrane from creasing.

A third object of the present invention is to provide a method of manufacturing a semiconductor device capable of reducing the time required for manufacturing the semiconductor device.

A fourth object of the present invention is to provide a method of manufacturing a semiconductor device capable of reducing labor required for designing a mask for patterning an etching layer of interest.

A fifth object of the present invention is to provide a method capable of manufacturing a semiconductor device using a thinned silicon wafer without causing edge chipping of the silicon wafer.

One aspect of the present invention may provide an acceleration sensor including a circuit chip having a prescribed circuit built into a front surface thereof; a sensor chip bonded to the front surface of the circuit chip (in a face-to-face state); and a resin package for sealing the circuit chip and the sensor chip. The sensor chip includes: a membrane arranged to oppose to the front surface of the circuit chip and having a plurality of openings; a piezoresistor formed on a surface of the membrane opposed to the circuit chip; a support section provided on a side opposite to the circuit chip with respect to the membrane and supporting a peripheral edge portion of the membrane; and a weight section provided on the side opposite to the circuit chip with respect to the membrane and integrally held on a central portion of the membrane.

Another aspect of the present invention may provide a semiconductor device bonded to a front surface of a circuit chip having a prescribed circuit built thereinto and constituting an acceleration sensor with the circuit chip. The semiconductor device includes a membrane opposed to the front surface of the circuit chip and having a plurality of openings; a piezoresistor formed on a surface of the membrane opposed to the circuit chip; a support section provided on a side opposite to the circuit chip with respect to the membrane and supporting a peripheral edge portion of the membrane; and a weight section provided on the side opposite to the circuit chip with respect to the membrane and integrally held on a central portion of the membrane.

When acceleration acts on the acceleration sensor and the weight section oscillates, the membrane is deformed, and stress acts on the piezoresistor provided on the membrane. When the stress acts on the piezoresistor, the resistivity of the piezoresistor changes in proportion to the stress, and a signal corresponding to the change of the resistivity is input from the sensor chip (semiconductor device) to the circuit chip. The circuit (prescribed circuit) built into the circuit chip generates a signal corresponding to the amount of the change in the resistivity of the piezoresistor, and the signal is output from the circuit chip. Therefore, the acceleration acting on the acceleration sensor can be obtained on the basis of the signal output from the circuit chip.

The membrane and the weight section are formed integrally with each other, whereby the acceleration sensor can be downsized as compared with a structure including a weight independent of a circuit chip and a sensor chip.

The circuit chip and the sensor chip are sealed with the resin package. Therefore, no ceramic package is required that is employed in a conventional acceleration sensor. Consequently, the cost for the acceleration sensor can be reduced.

The acceleration sensor preferably includes a bump interposed between the circuit chip and the sensor chip and connecting the circuit chip and the sensor chip with each other at a prescribed interval. The circuit chip and the sensor chip can be precisely maintained at the prescribed interval by interposing the bump between the circuit chip and the sensor chip. Therefore, the range of oscillation of the weight section can be ensured in the direction opposed to the circuit chip and the sensor chip. Consequently, the acceleration can be excellently detected.

The bump preferably includes a circuit-chip-side bump projectingly formed on the front surface of the circuit chip with a Au material; a sensor-chip-side pad formed on the surface of the membrane opposed to the circuit chip with a Au material; and a connecting metal section formed of a Sn material for connecting the circuit-chip-side bump and the sensor-chip-side pad with each other. In other words, the bump interposed between the circuit chip and the sensor chip is preferably formed by connecting the circuit-chip-side bump and the sensor-chip-side bump of the Au material with each other by the connecting metal section of the Sn material. The Sn material has a lower melting point than that of the Au material, whereby the circuit-chip-side bump and the sensor-chip-side bump can be reliably connected with each other by providing the Sn material for the connecting metal section to the distal end(s) of the circuit-chip-side bump and/or the sensor-chip-side pad and melting the Sn material by heating while the circuit-chip-side bump and the sensor-chip-side pad against are abut each other.

The acceleration sensor preferably includes a lid member provided so as to close a space between the support section and the weight section from the side opposite to the membrane. The space between the support section and the weight section is closed with the lid member from the side opposite to the membrane, whereby the material of the resin package can be prevented from infiltrating into the space between the support section and the weight section when the circuit chip and the sensor chip are sealed with the resin package.

The acceleration sensor preferably includes a surface film provided on the front surface of the circuit chip for regulating the amount of oscillation of the weight section in the direction opposed to the circuit chip and the sensor chip. In this case, the amount of oscillation of the weight section is regulated by the surface film in the direction opposed to the circuit chip and the sensor chip, whereby the membrane can be prevented from breakage resulting from excessive oscillation of the weight section.

The weight section is preferably shaped such that a sectional area taken along a plane perpendicular to the direction opposed to the circuit chip and the sensor chip increases as separating from the membrane. In this case, a surface of the weight section exhibiting the smallest sectional area along the plane perpendicular to the direction opposed to the circuit chip and the sensor chip is connected to the membrane. In the weight section, the sectional area taken along the plane perpendicular to the direction opposed to the circuit chip and the sensor chip increases as separating from the surface connected to the membrane. Therefore, the weight section reliably oscillates even by small acceleration in the direction perpendicular to that opposed to the circuit chip and the sensor chip to deform the membrane. Thus, the acceleration sensor can excellently detect the small acceleration in the direction perpendicular to that opposed to the circuit chip and the sensor chip.

Still another aspect of the present invention may provide a semiconductor device includes a membrane; and a support section for supporting a peripheral edge portion of the membrane. The membrane is provided with a plurality of openings having longitudinal portions.

This semiconductor device may further include a plurality of piezoresistors formed on the membrane; and a weight section formed on the same side as the support section with respect to the membrane and integrally held on a central portion of the membrane. When acceleration is caused to the weight section, the weight section oscillates to vibrate the membrane, and stress acts on the piezoresistors provided on the membrane. The resistivity of the piezoresistors changes in proportion to the stress acting thereon. When the change in the resistivity of each piezoresistor is extracted as a signal, the direction (triaxial direction) and the magnitude of the acceleration acting on the weight section can be obtained on the basis of the signal. In other words, the semiconductor device can be employed for an acceleration sensor, when further including the piezoresistors and the weight section.

Since the plurality of openings having the longitudinal portions are provided in the membrane, distortion of the membrane caused by vibration can be absorbed by deformation of the openings. Therefore, the distortion of the membrane can be prevented from propagation to the peripheral edge portion, and the peripheral edge portion of the membrane can be prevented from creasing.

The membrane is preferably formed a rectangular opening elongated in one direction and another rectangular opening elongated in the other direction perpendicular to the one direction alternately in the one direction and the other direction. Thus, distortion of the membrane in any direction can be absorbed by deformation of the rectangular opening elongated in the one direction and/or the rectangular opening elongated in the other direction. Therefore, the distortion of the membrane can be reliably prevented from propagation to the peripheral edge portion.

A further aspect of the present invention may provide a method of manufacturing a semiconductor device, including: a non-etching film forming step of forming a non-etching film having resistance to an etching solution on a front surface of a silicon wafer; a resistance element forming step of forming a piezoresistor on the non-etching film; an opening forming step of forming a plurality of openings for exposing the silicon wafer in an annular region located between a peripheral edge portion and a central portion of the unetched film; and an etching step of removing a portion of the silicon wafer opposed to the annular region by supplying the etching solution to the silicon wafer through the plurality of openings.

According to the method of manufacturing a semiconductor device, the semiconductor device can be manufactured. According to the method, further, the sensor chip can be manufactured. Therefore, the method of manufacturing a semiconductor device can also be referred to as a method of manufacturing the sensor chip.

According to the method of manufacturing a semiconductor device, the silicon wafer can be etched from a rear surface side obviously, and can also be etched from a front surface side by supplying the etching solution through the openings formed in the non-etching film.

When the etching solution is supplied to both of the front and rear surfaces of the silicon wafer, the etching progresses from both of the front and rear surfaces of the silicon wafer, whereby the time required for removing the portion of the silicon wafer opposed to the annular region can be reduced. Consequently, the time required for manufacturing the sensor chip can be reduced.

The method of manufacturing a semiconductor device preferably further includes a rear surface grinding step of grinding the rear surface of the silicon wafer in advance of the etching step. In this case, the rear surface of the silicon wafer is ground in advance of the etching step, whereby the amount of the silicon wafer etched by the etching solution can be reduced. Consequently, the time required for the etching can be reduced.

A further aspect of the present invention may provide a method of manufacturing a semiconductor device, including: a mask layer forming step of forming a mask layer having resistance to an etching solution on an etching layer of interest; a through-hole forming step of forming a plurality of through-holes in the etching layer of interest and the mask layer to penetrate the etching layer of interest and the mask layer in the laminating direction; and an etching step of patterning the etching layer of interest by supplying the etching solution into the through-holes from a side of the mask layer and progressing etching in a direction intersecting with the laminating direction from the through-holes.

According to this method of manufacturing a semiconductor device, the mask layer having resistance to the etching solution is formed on the etching layer of interest. Thereafter, the plurality of through-holes are formed in the etching layer of interest and the mask layer to penetrate the etching layer of interest and the mask layer. Then, the etching solution for etching the etching layer of interest is supplied into the plurality of through-holes from the side of the mask layer. Thus, the etching layer of interest is etched through the mask layer having the plurality of through-holes. The etching progresses in the direction intersecting with the laminating direction of the etching layer of interest and the mask layer from the side surfaces of the respective through-holes. When the pitch of the through-holes (interval between the through-holes) and the positions thereof are decided in consideration of only the etching rate in the direction intersecting with the laminating direction, the etching layer of interest can be patterned into a desired shape by communicating the plurality of through-holes with one another in the etching layer of interest. Thus, the labor for designing a mask for patterning the etching layer of interest can be reduced as compared with a conventional method.

A further aspect of the present invention may provide a method of manufacturing a semiconductor device, including: a first wafer thinning step of thinning a central portion of a silicon wafer by forming a recess on a central portion of a rear surface of the silicon wafer opposite to a front surface to be provided with a device; and a second wafer thinning step of thinning the central portion of the silicon wafer and an edge portion around the central portion thereof by etching the front surface and the rear surface of the silicon wafer after the first wafer thinning step.

According to the method of manufacturing a semiconductor device, the central portion of the silicon wafer is thinned by forming the recess on the central portion of the rear surface of the silicon wafer (portion included in a device forming region on the rear surface of the silicon wafer). Thereafter, the central portion and the edge portion of the silicon wafer are thinned by etching the front surface and the rear surface of the silicon wafer. The etching progresses at the same rate on the front surface and the central and edge portions of the rear surface of the silicon wafer. When the central portion of the silicon wafer is thinned to a desired thickness, the edge portion of the silicon wafer has a thickness greater than that of the central portion by the depth of the recess. Thus, mechanical strength can be ensured on the edge portion of the silicon wafer, whereby the silicon wafer can be prevented from edge chipping. Therefore, a semiconductor device employing the thinned silicon wafer can be manufactured without causing edge chipping of the silicon wafer.

The above and other objects, features and effects of the present invention will become more apparent from the following detailed description of the present invention with reference to accompanying drawings.

DETAILED DESCRIPTION OF PREFERRED EMBODIMENTS

Embodiments of the present invention are now described in detail with reference to the accompanying drawings.

First Embodiment

Figure 1:
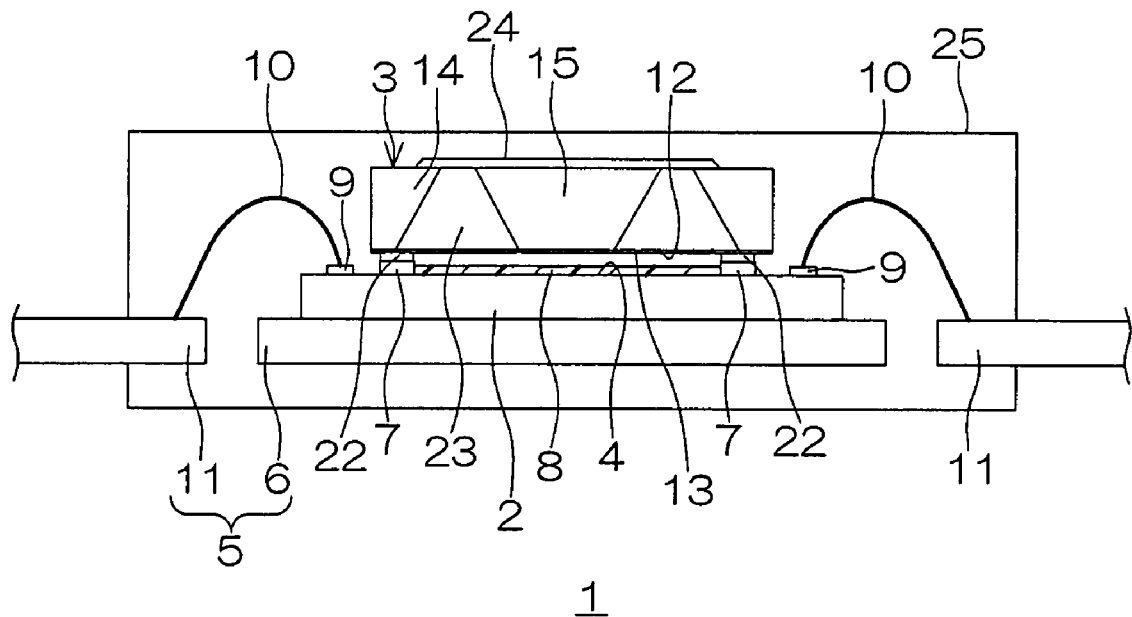
FIG. 1 is a sectional view schematically showing the structure of an acceleration sensor according to a first embodiment of the present invention.

FIG. 1 is a sectional view schematically showing the structure of an acceleration sensor according to a first embodiment of the present invention.

The acceleration sensor 1 is a piezoresistance type acceleration sensor. The acceleration sensor 1 has a chip-on-chip structure formed by superposing and bonding a circuit chip 2 and a sensor chip 3 serving as a semiconductor device with and to each other.

The circuit chip 2 has a generally rectangular shape in plan view. The circuit chip 2 is die-bonded to an island section 6 of a lead frame 5 in a face-up state directing the front surface 4 thereof upward.

A circuit (not shown) generating a signal corresponding to a change in the resistivity of piezoresistors 16 described later and the like are built into a surface layer portion of the circuit chip 2 including the front surface 4.

A chip bonding region is set at the central portion of the front surface 4 of the circuit chip 2, so that the sensor chip 3 is bonded thereto. A plurality of circuit-chip-side bumps 7 are arranged on the chip bonding region along the peripheral edge of the chip bonding region at intervals from one another. The respective circuit-chip-side bumps 7 are projectingly formed on the front surface 4 using a Au material. A surface film 8 of polyimide is formed on the front surface 4 of the circuit chip 2. The chip bonding region is covered with the surface film 8.

On the front surface 4 of the circuit chip 2, a plurality of external connection pads 9 are provided on the peripheral edge portion surrounding the chip bonding region. The external connection pads 9 are electrically connected (wire-bonded) to lead portions 11 of the lead frame 5 through bonding wires 10.

The sensor chip 3 has a generally rectangular outline smaller than the circuit chip 2 in plan view. This sensor chip 3 is bonded to the chip bonding region of the front surface 4 of the circuit chip 2 in a face-down state directing the front surface 12 thereof downward.

The sensor chip 3 integrally includes a membrane 13 opposed to the front surface 4 of the circuit chip 2, a support section 14 provided on the side opposite to the circuit chip 2 with respect to the membrane 13 for supporting the peripheral edge portion of the membrane 13, and a weight section 15 provided on the side opposite to the circuit chip 2 with respect to the membrane 13 and held at the central portion of the membrane 13.

Figure 2:
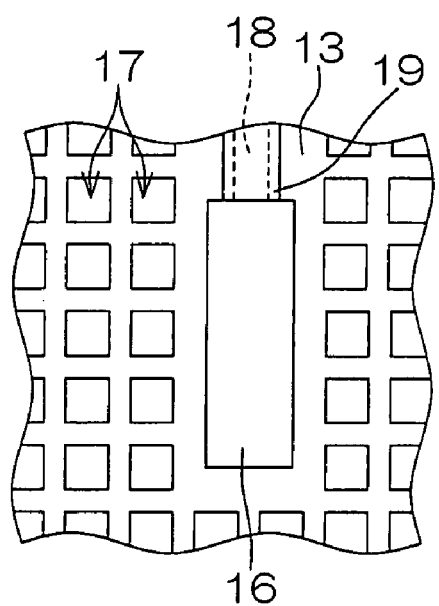
FIG. 2 illustrates a part of a membrane of a sensor chip according to the first embodiment.

The surface of the membrane 13 opposed to the circuit chip 2 forms the front surface 12 of the sensor chip 3. The membrane 13 is made of $SiO_2$ (silicon oxide), for example, and formed to have a thickness of 1 to 10 μm. On the surface of the membrane 13 opposed to the circuit chip 2, a plurality of (e.g. 16) piezoresistors 16 are formed on an annular region located between the peripheral edge portion and the central portion thereof, as shown in FIG. 2. Further, a large number of rectangular openings 17 are formed in the annular region. Thus, the annular region located between the peripheral edge portion and the central portion of the membrane 13 is in the form of a mesh.

Wires 18 connected to the respective piezoresistors 16 are also formed on the surface of the membrane 13 opposed to the circuit chip 2. Au is employed as the material for the wires 18. Each wire 18 is covered with a wire protective film 19 of SiN (silicon nitride). Each wire 18 extends toward the peripheral edge portion of the membrane 13, and has a pad 21 (see FIG. 3G) exposed from a pad opening 20 (see FIG. 3G) formed in the wire protective film 19 in the peripheral edge portion. Each pad 21 is arranged on a position opposed to each circuit-chip-side bump 7 of the circuit chip 2.

When the circuit chip 2 and the sensor chip 3 are bonded to each other as shown in FIG. 1, each circuit-chip-side bump 7 of the circuit chip 2 and each pad 21 of the sensor chip 3 are opposed to each other while abutting the top faces thereof against each other, and connected to each other through a connecting metal section 22 of a Sn material.

Before the circuit chip 2 and the sensor chip 3 are bonded to each other, the Sn material for forming the connecting metal section 22 is applied to the top face of each circuit-chip-side bump 7 of the circuit chip 2. When the circuit chip 2 and the sensor chip 3 are bonded to each other and heat-treated while abutting each circuit-chip-side bump 7 of the circuit chip 2 and each pad 21 of the sensor chip 3 against each other, the Sn material applied to the top face of each circuit-chip-side bump 7 is melted. Thus, the connecting metal section 22 is formed between each circuit-chip-side bump 7 and each pad 21. Each circuit-chip-side bump 7 and each pad 21 can be reliably connected to each other by the connecting metal section 22.

When each circuit-chip-side bump 7 and each pad 21 are connected to each other through the connecting metal section 22, the circuit chip 2 and the sensor chip 3 are electrically connected with each other through each bump formed by connecting each circuit-chip-side bump 7 and each pad 21 to each other through the connecting metal section 22, and mechanically connected with each other while keeping a prescribed interval therebetween.

The support section 14 and the weight section 15 are made of Si, and separated from each other by a rectangular annular groove section 23 having a section in the form of an isosceles trapezoid narrowing upward.

The support section 14 is in the form of an annulus, whose sectional area taken along a plane parallel to the surface connected to the membrane 13 monotonically increases as separating from the membrane 13. The outer side surface of the support section 14 is perpendicular to the surface connected to the membrane 13. The inner side surface of the support section 14 is inclined at an angle of 54.7° with respect to the surface connected to the membrane 13.

The weight section 15 is in the form of an isosceles trapezoid in section, whose sectional area taken along a plane parallel to the surface connected to the membrane 13 monotonically increases as separating from the membrane 13. The side surfaces of this weight section 15 are also inclined at the angle of 54.7° with respect to the surface connected to the membrane 13.

A lid member 24 is provided on the rear surface of the sensor chip 3 opposite to the front surface 4 to close the groove section 23 located between the support section 14 and the weight section 15. The circuit chip 2 and the sensor chip 3 are sealed with a resin package 25 along with the lead frame 5 and the bonding wires 10. The lid member 24 is so provided that the material of the resin package 25 can be prevented from infiltrating into the groove section 23 when the chips 2 and 3 are sealed with the resin package 25. Parts of the lead portions 11 of the lead frame 5 are exposed from the resin package 25 to function as outer connecting portions (outer lead portions) for a printed wiring board or the like.

When acceleration acts on the acceleration sensor 1 and the weight section 15 oscillates, the membrane 13 is deformed, and stress acts on the piezoresistors 16 provided on the membrane 13. When the stress acts on the piezoresistors 16, the resistivity thereof changes in proportion to the stress, and a signal corresponding to the change of the resistivity is input from the sensor chip 3 to the circuit chip 2. The circuit built into the circuit chip 2 generates a signal corresponding to the amount of the change in the resistivity of the piezoresistors 16, and the signal is output to the lead portions 11 that functions as the external connecting portions through the external connection pads 9 and the bonding wires 10. Therefore, the direction (triaxial direction) and the magnitude of the acceleration acting on the acceleration sensor 1 can be obtained on the basis of the signal output from the lead portions 11.

FIGS. 3A to 3G are schematic sectional views for illustrating steps of manufacturing the sensor chip 3.

Figure 3A:
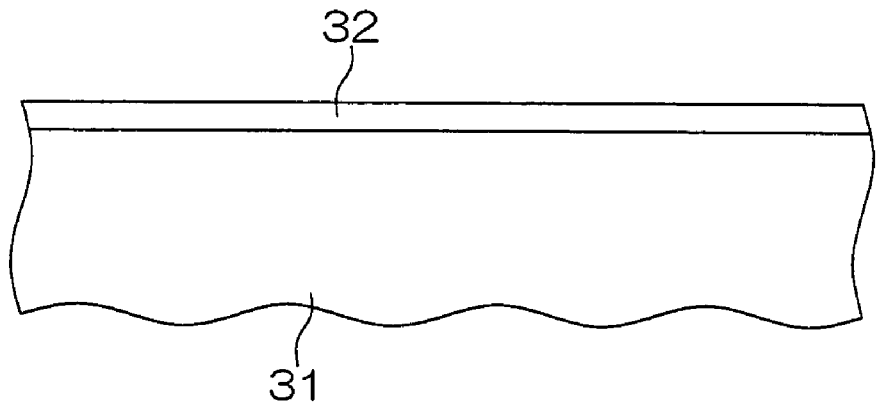
FIG. 3A is a schematic sectional view for illustrating a step of manufacturing the sensor chip according to the first embodiment.

For manufacture the sensor chip 3, a silicon wafer 31 having a thickness of 625 μm, for example, is employed. First, a silicon oxide film 32 serving as a non-etching film is formed on the front surface of the silicon wafer 31 by plasma treatment, as shown in FIG. 3A (non-etching film forming step).

Figure 3B:
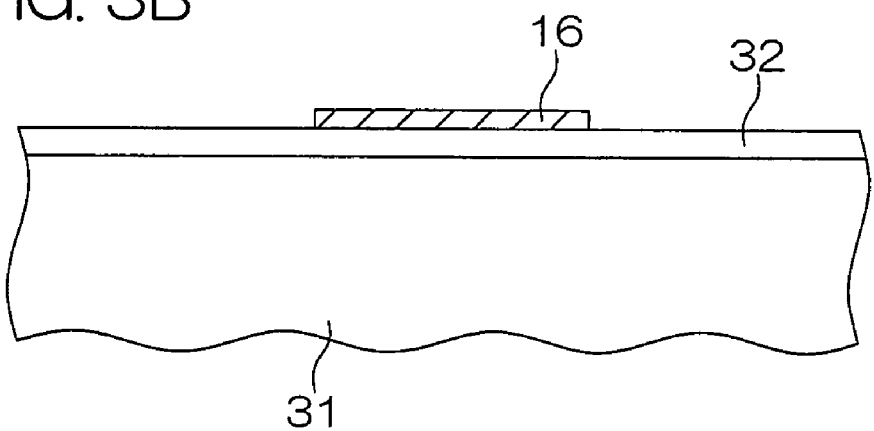
FIG. 3B is a schematic sectional view showing a step next to that shown in FIG. 3A.

Then, the plurality of piezoresistors 16 are formed on the silicon oxide film 32 using TiN (titanium nitride), as shown in FIG. 3B (resistance element forming step).

Figure 3C:
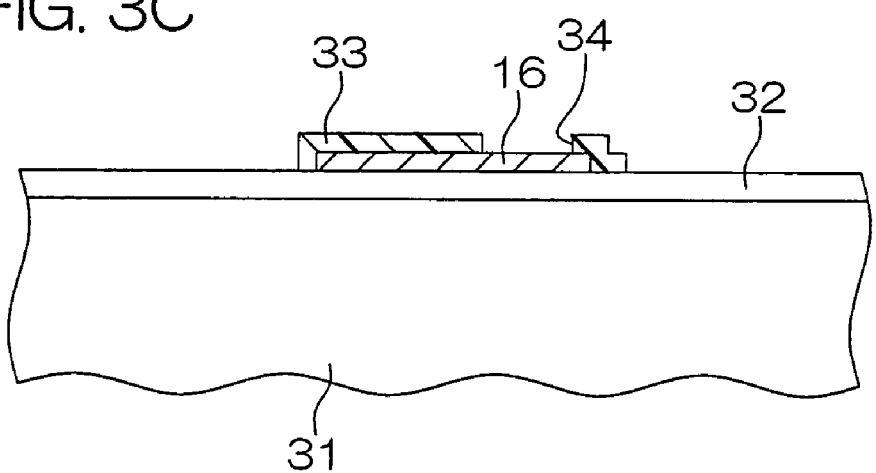
FIG. 3C is a schematic sectional view showing a step next to that shown in FIG. 3B.

Then, a resistance protective film 33 of $SiO_2$ is formed to cover each piezoresistor 16, as shown in FIG. 3C. Each resistance protective film 33 is partially removed, so that a connection opening 34 for partially exposing the piezoresistor 16 is formed in each resistance protective film 33.

Figure 3D:
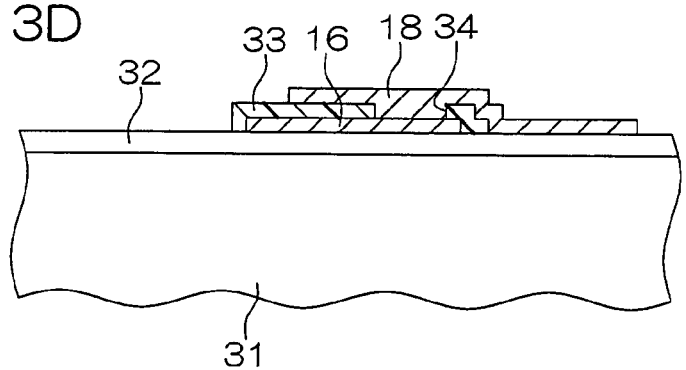
FIG. 3D is a schematic sectional view showing a step next to that shown in FIG. 3C.

Thereafter, the wire 18 is formed over each resistance protective film 33 and the silicon oxide film 32, as shown in FIG. 3D. Each wire 18 is connected to the corresponding piezoresistor 16 through the connection opening 34 formed in the resistance protective film 33.

Figure 3E:
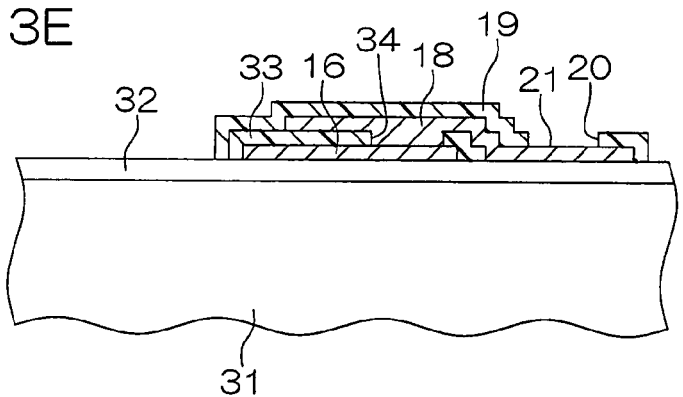
FIG. 3E is a schematic sectional view showing a step next to that shown in FIG. 3D.

Then, the wire protective film 19 of SiN is formed to cover each wire 18, as shown in FIG. 3E. Then, the pad opening 20 for partially exposing the wire 18 is formed in each wire protective film 19.

Figure 3F:
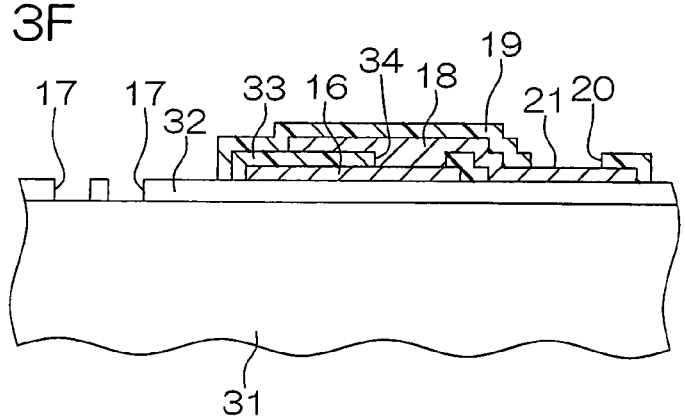
FIG. 3F is a schematic sectional view showing a step next to that shown in FIG. 3E.

Then, the large number of rectangular openings 17 are formed in the annular region located between the peripheral edge portion and the central portion of the silicon oxide film 32 (region opposed to the groove section 23 formed later), as shown in FIG. 3F (opening forming step). Consequently, the silicon wafer 31 is exposed through the large number of openings 17.

Then, the rear surface of the silicon wafer 31 is ground by a thickness of 50 μm, for example (rear surface grinding step).

Then, an etching solution having ability to etch the silicon wafer 31 is supplied to both of the front and rear surfaces of the silicon wafer 31. A solution prepared by heating an aqueous solution of TMAH (tetramethyl ammonium hydroxide) having a concentration of 50% to 80° C., for example, can be employed as such an etching solution.

Figure 3G:
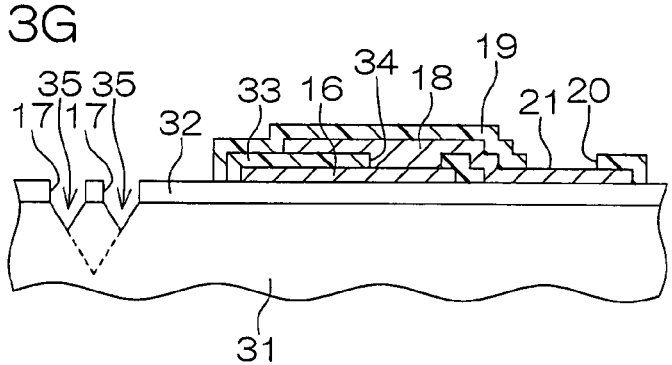
FIG. 3G is a schematic sectional view showing a step next to that shown in FIG. 3F.

The etching solution supplied to the front surface of the silicon wafer 31 is supplied to the silicon wafer 31 through each opening 17. Thus, the silicon wafer 31 is pyramidally etched from the portion facing each opening 17, as shown in FIG. 3G (etching step). The etching progresses in the thickness direction of the silicon wafer 31 (vertical direction) and the direction parallel to the front surface thereof (transverse direction) while each side surface of each pyramidal recess 35 formed by the etching maintains the inclination of 54.7° with respect to the front surface of the silicon wafer 31. When the recesses 35 formed under the adjacent openings 17 are linked with one another, the transverse etching rapidly progresses, and the portions located under the piezoresistors 16 are also etched. On the other hand, the etching solution is also supplied to the rear surface of the silicon wafer 31, whereby the silicon wafer 31 is vertically etched at a generally uniform in-plane speed also from the rear surface side (rear surface etching step). Therefore, a portion of the silicon wafer 31 opposed to an annular region located between the peripheral edge portion and the central portion of the silicon oxide film 32 is completely removed over the thickness direction, and the annular groove section 23 shown in FIG. 1 is formed in the silicon wafer 31. Consequently, the silicon oxide film 32 defines the membrane 13, and the silicon wafer 31 is divided into the support section 14 supporting the peripheral edge portion of the membrane 13 and the weight section 15 held on the central portion of the membrane 13 by the groove section 23. Thus, the sensor chip 3 shown in FIG. 1 is obtained.

The wires 18 are made of Au, so that the wires 18 are not corroded by the etching solution despite the exposure through the pad openings 20. Therefore, when the silicon wafer 31 is etched by the etching solution, there is no need to form protective films for protecting the wires 18 exposed through the pad openings 20 against the etching solution.

As hereinabove described, the sensor chip 3 face-to-facedly bonded to the front surface 4 of the circuit chip 2 includes the membrane 13, the support section 14 supporting the peripheral edge portion of the membrane 13 and the weight section 15 held on the central portion of the membrane 13. The membrane 13 and the weight section 15 are formed integrally with each other. Thus, the acceleration sensor 1 can be downsized as compared with a structure including a weight section independent of a circuit chip and a sensor chip.

Further, the circuit chip 2 and the sensor chip 3 are sealed with the resin package 25. Therefore, the acceleration sensor 1 requires no ceramic package that is used for a conventional acceleration sensor. Consequently, the cost for the acceleration sensor 1 can be reduced.

The groove section 23 located between the support section 14 and the weight section 15 is closed by the lid member 24 from the side opposite to the membrane 13. Therefore, the material of the resin package 25 can be prevented from infiltrating into the space between the support section 14 and the weight section 15 when the circuit chip 2 and the sensor chip 3 are sealed with the resin package 25.

Further, the bumps formed by connecting the circuit-chip-side bumps 7 and the pads 21 with one another by the connecting metal sections 22 are interposed between the circuit chip 2 and the sensor chip 3. Thus, the circuit chip 2 and the sensor chip 3 can be precisely maintained at a prescribed interval. Therefore, the range of oscillation of the weight section 15 can be ensured in the direction opposed to the circuit chip 2 and the sensor chip 3. Consequently, the acceleration can be excellently detected.

In addition, the surface film 8 of polyimide is formed on the front surface 4 of the circuit chip 2. The surface film 8 can prevent the weight section 15 from excessively oscillating in the direction opposed to the circuit chip 2 and the sensor chip 3. Therefore, the membrane 13 can be prevented from breakage or the like resulting from excessive oscillation of the weight section 15.

In the weight section 15, the surface having the smallest sectional area taken along the plane perpendicular to the direction opposed to the circuit chip 2 and the sensor chip 3 is connected to the membrane 13. The sectional area of the weight section 15 taken along the plane perpendicular to the direction opposed to the circuit chip 2 and the sensor chip 3 increases as separating from the surface connected to the membrane 13. Therefore, the weight section 15 reliably oscillates even by small acceleration in the direction perpendicular to that opposed to the circuit chip 2 and the sensor chip 3 to deform the membrane 13. Thus, the acceleration sensor 1 can excellently detect the small acceleration in the direction perpendicular to that opposed to the circuit chip 2 and the sensor chip 3.

In the steps of manufacturing the sensor chip 3, the silicon oxide film 32 serving as a non-etching film having resistance to the etching solution is formed on the front surface of the silicon wafer 31, and the large number of openings 17 exposing the silicon wafer 31 are formed in the annular region located between the peripheral edge portion and the central portion of the silicon oxide film 32. Therefore, the silicon wafer 31 can be etched from the front surface side by supplying the etching solution to the front surface of the silicon wafer 31 through the large number of openings 17.

According to the first embodiment, the etching solution is supplied to both of the front and rear surfaces of the silicon wafer 31. Therefore, the etching progresses from both of the front and rear surfaces of the silicon wafer 31, whereby the time necessary for removing the portion of the silicon wafer 31 opposed to the annular region can be reduced.

Further, the rear surface of the silicon wafer 31 is ground in advance of the etching step for the silicon wafer 31. Therefore, the amount of the silicon wafer 31 etched by the etching solution can be reduced, and the time required for this etching can be further reduced.

While the rectangular openings 17 are formed in the silicon oxide film 32 (membrane 13) according to the first embodiment, the openings 17 are not limited to the rectangular shape, but may alternatively have a circular shape. In this case, the groove section 23 has a section in the form of an isosceles trapezoid narrowing upward, and the weight section 15 is in the form of a truncated cone having a monotonically increasing sectional area taken along a plane parallel to the surface connected to the membrane 31.

The wires 18 may be omitted. In this case, the parts of the piezoresistors 16 exposed from the connecting openings 34 formed in the resistance protective film 33 may be used as pads connected to the circuit-chip-side bumps 7.

While the silicon oxide film 32 is formed on the front surface of the silicon wafer 31, a silicon nitride film may alternatively be formed by plasma treatment in place of the silicon oxide film 32. In this case, SiN is employed as the material for the membrane 13.

The aforementioned method of manufacturing the sensor chip 3 is not limited to the sensor chip 3 employed for the acceleration sensor 1, but is also applicable to a method of manufacturing a sensor chip (semiconductor device) employed for a piezoresistance type semiconductor pressure sensor for detecting the pressure of a gas or the like.

Second Embodiment

Figure 4:
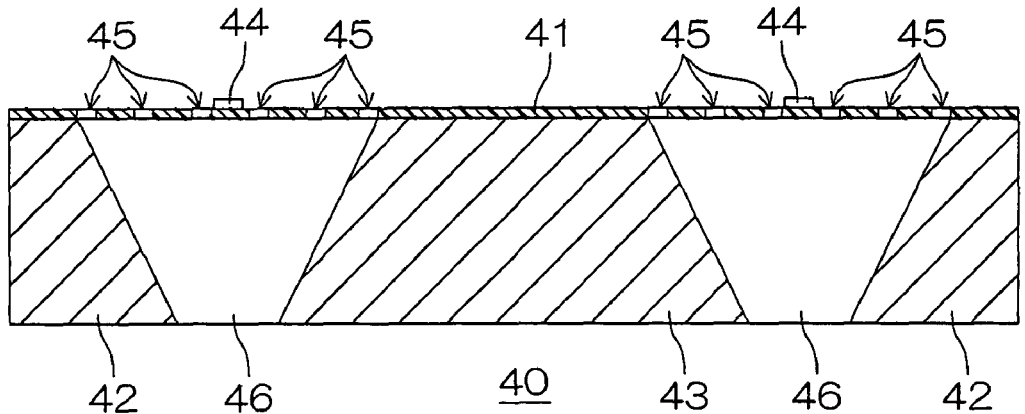
FIG. 4 is a sectional view schematically showing the structure of a semiconductor device according to a second embodiment of the present invention.

FIG. 4 is a sectional view schematically showing the structure of a semiconductor device according to a second embodiment of the present invention.

This semiconductor device 40 is employed for an acceleration sensor for detecting the acceleration of an object, for example. The semiconductor device 40 includes a membrane 41, a support section 42 provided on the lower surface of the membrane 41 for supporting the peripheral edge portion of the membrane 41, and a weight section 43 provided on the lower surface of the membrane 41 and held on the central portion of the membrane 41.

The membrane 41 is made of $SiO_2$ (silicon oxide), for example, and generally in the form of a rectangle having a thickness of 1 to 10 μm in plan view. A plurality of (e.g. 16) piezoresistors 44 are formed on the membrane 41. A large number of openings 45 are formed in a quadrangular annular region located between the peripheral edge portion and the central portion of the membrane 41.

The support section 42 and the weight section 43 are made of Si, and separated from each other by a groove section 46 having a quadrangular annular shape in plan view. This groove section 46 has a section in the form of an isosceles trapezoid narrowing upward as separating from the membrane 41.

The support section 42 is in the form of a quadrangular annulus in plan view, whose sectional area taken along a plane parallel to the surface connected to the membrane 41 monotonically increases as separating from the membrane 41. The outer side surfaces of the support sections 42 are perpendicular to the surface connected to the membrane 41. On the other hand, the inner side surfaces of the support section 42 are inclined at an angle of 54.7° with respect to the surface connected to the membrane 41.

The weight section 43 is in the form of an isosceles trapezoid in section widening as separating from the membrane 41. Each side surface of the weight section 43 is inclined at the angle of 54.7° with respect to the surface connected to the membrane 41.

When acceleration acts on this semiconductor device 40 and the weight section 43 oscillates, the membrane 41 is deformed, and stress acts on each piezoresistor 44 provided on the membrane 41. The resistivity of the piezoresistor 44 changes in proportion to the stress acting thereon. When the amount of the change in the resistivity of each piezoresistor 44 is extracted as a signal, the direction (triaxial direction) and the magnitude of the acceleration acting on the weight section 43 (semiconductor device 40) can be obtained on the basis of this signal.

Figure 5:
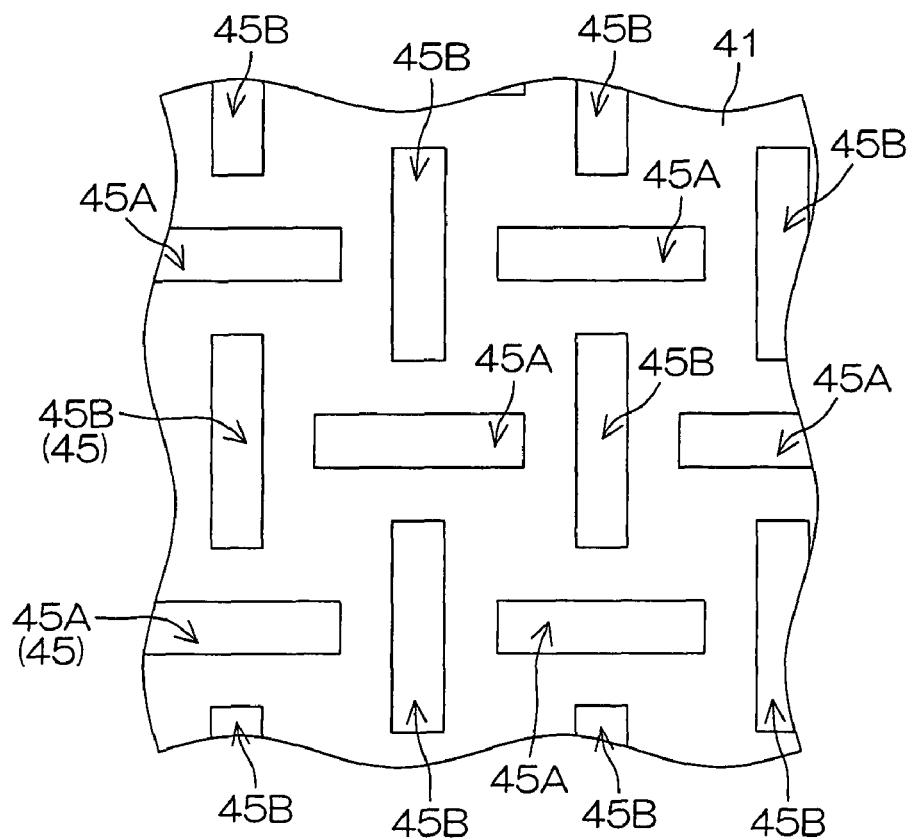
FIG. 5 is a plan view showing a part of a membrane of the semiconductor device according to the second embodiment in an enlarged manner.

FIG. 5 is a plan view showing a part of the membrane 41 in an enlarged manner.

As shown in FIG. 5, the large number of openings 45 formed in the membrane 41 include rectangular openings 45A elongated in one direction and rectangular openings 45B elongated in the other direction perpendicular to the one direction. The openings 45A and 45B are alternately formed in the one and the other directions. In other words, the rectangular openings 45A elongated in the one direction and the rectangular openings 45B elongated in the other direction perpendicular to the one direction are alternately formed in the membrane 41 in the one and the other directions.

According to this structure, distortion of the membrane 41 caused by vibration can be absorbed by the rectangular openings 45A elongated in the one direction and/or the rectangular openings 45B elongated in the other direction regardless of the direction of the distortion. Therefore, the distortion can be reliably prevented from propagation to the peripheral edge portion of the membrane 41. Consequently, the peripheral edge portion of the membrane 41 can be prevented from creasing.

The semiconductor device 40 having the aforementioned structure is manufactured in the following manner:

A silicon wafer is employed for manufacturing the semiconductor device 40. First, a silicon oxide film having resistance to an etching solution capable of etching the silicon wafer is formed on the front surface of the silicon wafer by plasma treatment. Then, the plurality of piezoresistors 44 are formed on the silicon oxide film by TiN (titanium nitride). Further, wires connected to the piezoresistors 44 and the like are formed. Thereafter the large number of openings 45 are formed in the silicon oxide film. Thus, the silicon wafer is exposed through the large number of openings 45.

Then, the rear surface of the silicon wafer is ground if necessary, and an etching solution having ability to etch the silicon wafer is supplied to both of the front and rear surfaces of the silicon wafer. A solution prepared by heating an aqueous solution of TMAH (tetramethyl ammonium hydroxide) having a concentration of 50% to 80° C., for example, can be employed as such an etching solution. The etching solution supplied to the front surface of the silicon wafer is supplied to the silicon wafer through each opening 45. Thus, the silicon wafer is etched in the form of a triangle in section from the portion facing each opening 45. The etching progresses in the thickness direction of the silicon wafer (vertical direction) and the direction parallel to the front surface thereof (transverse direction) while each side surface of each recess formed by the etching maintains the inclination of 54.7° with respect to the front surface of the silicon wafer. When the recesses located under the adjacent openings 45 are linked with one another, the transverse etching rapidly progresses. On the other hand, the etching solution is also supplied to the rear surface of the silicon wafer, whereby the silicon wafer is vertically etched at a generally uniform in-plane speed also from the side of the rear surface. Therefore, a portion of the silicon wafer opposed to an annular region located between the peripheral edge portion and the central portion of the silicon oxide film (membrane 41) is completely removed over the thickness direction, and the annular groove section 46 is formed in the silicon wafer. Consequently, the silicon oxide film defines the membrane 41, and the silicon wafer is divided into the support section 42 supporting the peripheral edge portion of the membrane 41 and the weight section 43 held on the central portion of the membrane 41 by the groove section 46. Thus, the semiconductor device 40 shown in FIG. 4 is obtained.

Figure 6:
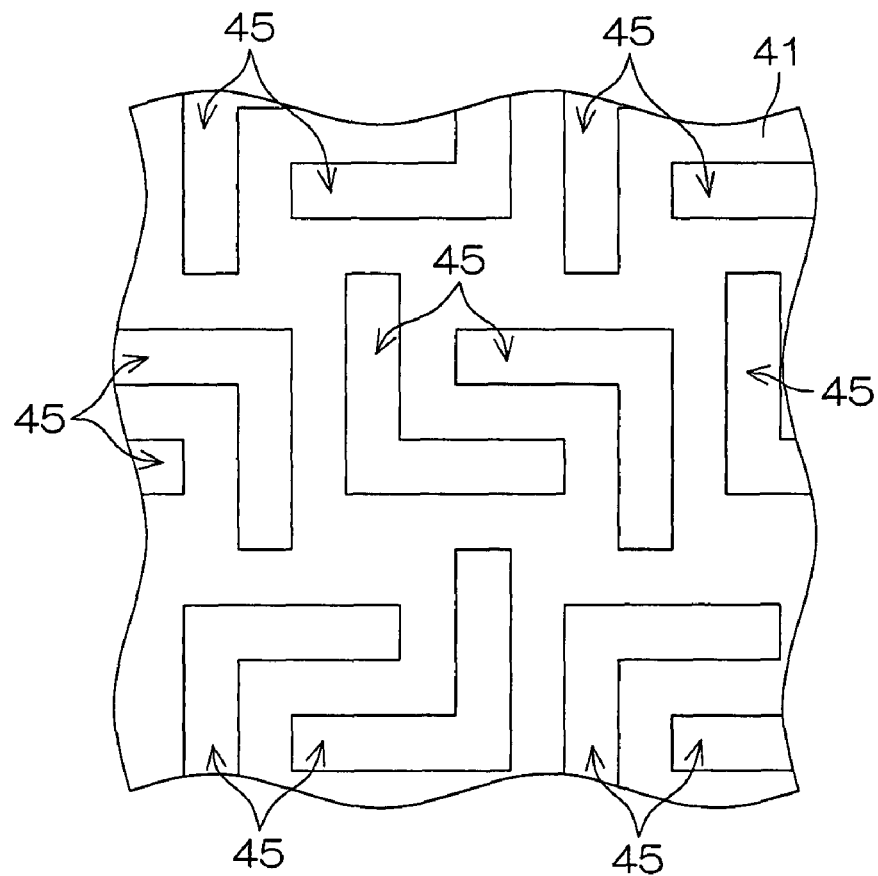
FIG. 6 is a plan view showing another shape of openings formed in the membrane.

While the structure that the rectangular openings 45 are formed in the membrane 41 is described in the second embodiment, a large number of L-shaped (hooked) openings 45 may alternatively be formed in the membrane 41, as shown in FIG. 6. In other words, the openings 45 formed in the membrane 41 may have at least partially longitudinal portions. When the large number of openings 45 having longitudinal portions are formed in the membrane 41, distortion of the membrane 41 caused by vibration can be absorbed by deformation of the openings 45. Therefore, the distortion can be prevented from propagation to the peripheral edge portion of the membrane 41, and the peripheral edge portion of the membrane 41 can be prevented from creasing.

The structure that the openings 45 having longitudinal portions are formed in the membrane 41 is not limited to the acceleration sensor, but is also applicable to a semiconductor device employed for a piezoresistance type pressure sensor including a piezoresistor whose resistivity is changed by deformation of a membrane resulting from the pressure of a gas or the like, for example. The structure is further applicable to a semiconductor device employed for a capacitance type pressure sensor including a capacitor whose capacitance is changed by deformation of a membrane resulting from the pressure of a gas or the like or for a microphone. In other words, the structure is widely applicable to a semiconductor device including a membrane.

Third Embodiment

Figure 7:
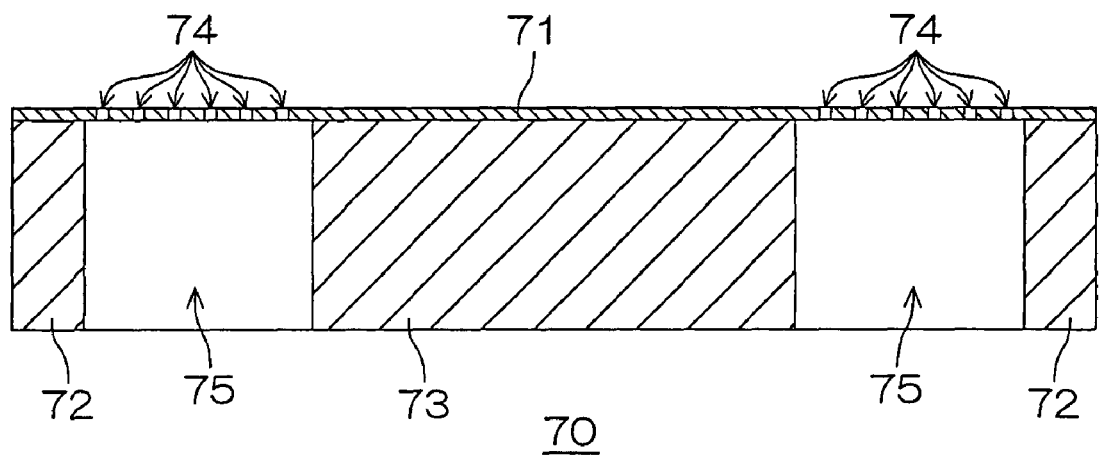
FIG. 7 is a sectional view schematically showing the structure of a semiconductor device according to a third embodiment of the present invention.

FIG. 7 is a sectional view schematically showing the structure of a semiconductor device according to a third embodiment of the present invention.

This semiconductor device 70 is employed for an acceleration sensor for detecting the acceleration of an object. The semiconductor device 70 includes a membrane 71, a support section 72 provided on the lower surface of the membrane 71 for supporting the peripheral edge portion of the membrane 71, and a weight section 73 provided on the lower surface of the membrane 71 and held on the central portion of the membrane 71.

The membrane 71 is made of $SiO_2$ (silicon oxide), for example, and generally in the form of a rectangle having a thickness of 1 to 10 μm in plan view. A plurality of (e.g. 16) piezoresistors (not shown) are formed on this membrane 71. A large number of openings 74 are formed in a quadrangular annular region located between the peripheral edge portion and the central portion of the membrane 71.

The support section 72 and the weight section 73 are made of Si, and separated from each other by a groove section 75 having a quadrangular annular shape in plan view of a rectangular section.

The support section 72 is formed in a quadrangular annular shape in plan view, having the outer and inner side surfaces perpendicular to the membrane 71.

The weight section 73 is in the form of a prism having the same height to that of the support section 72.

When acceleration acts on the semiconductor device 70 and the weight section 73 oscillates, the membrane 71 is deformed, and stress acts on each piezoresistor provided on the membrane 71. The resistivity of the piezoresistor changes in proportion to the stress acting thereon. When the amount of the change in the resistivity of each piezoresistor is extracted as a signal, the direction (triaxial direction) and the magnitude of the acceleration acting on the weight section 73 (semiconductor device 70) can be obtained on the basis of this signal.

Figure 8A:
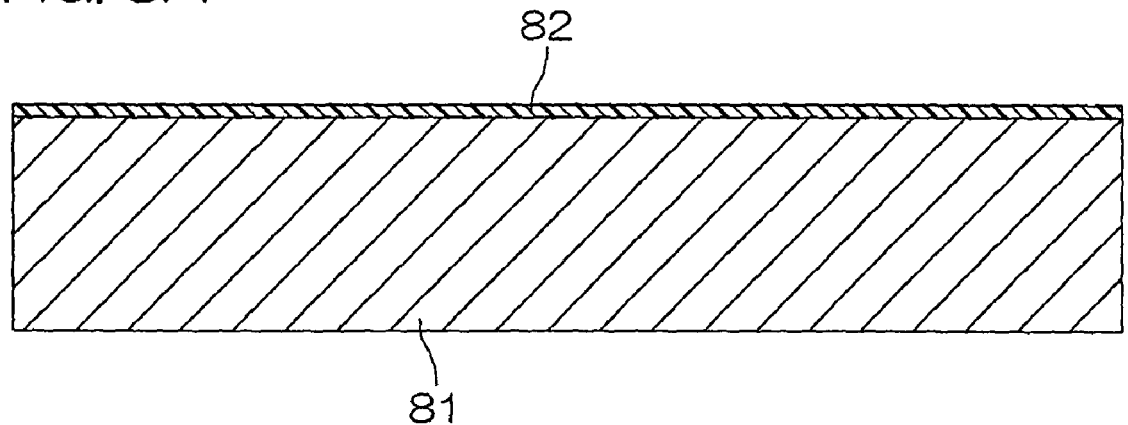
FIG. 8A is a schematic sectional view for illustrating a step of manufacturing the semiconductor device according to the second embodiment.
Figure 8B:
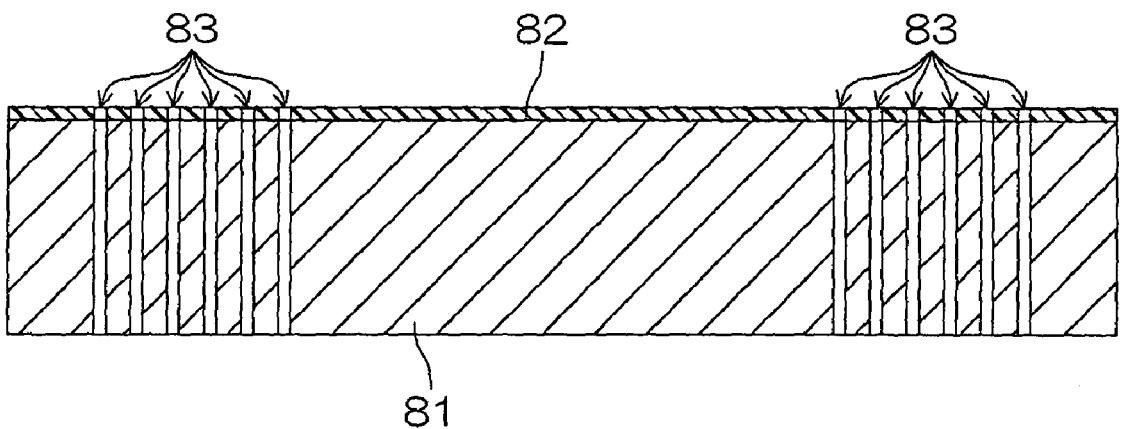
FIG. 8B is a schematic sectional view showing a step next to that shown in FIG. 8A.
Figure 8C:
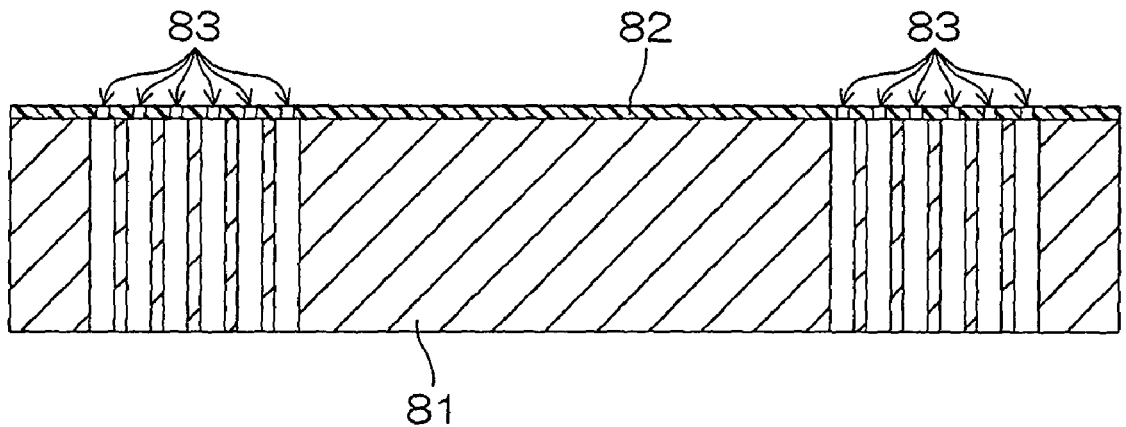
FIG. 8C is a schematic sectional view showing a step next to that shown in FIG. 8B.

FIGS. 8A to 8C are schematic sectional views for illustrating steps of manufacturing the semiconductor device 70.

A silicon wafer 81 is employed for manufacturing the semiconductor device 70. First, a silicon oxide film 82 serving as a mask layer having resistance to an etching solution capable of etching the silicon wafer 81 is formed on the front surface of the silicon wafer 81 by plasma treatment, as shown in FIG. 8A (mask layer forming step).

Then, a large number of through-holes 83 are formed in regions (corresponding to the groove section 75 shown in FIG. 7) having quadrangular annular shapes in plan view, located between the peripheral edge portions and the central portions of the silicon wafer 81 and the silicon oxide film 82 by dry etching to penetrate the silicon wafer 81 and the silicon oxide film 82 in the stacking direction, as shown in FIG. 8B.

Then, the etching solution capable of etching the silicon wafer 81 is supplied into each through-hole 83 from the side of the silicon oxide film 82 (etching step). A solution prepared by heating an aqueous solution of TMAH (tetramethyl ammonium hydroxide) having a concentration of 50% to 80° C., for example, can be employed as such an etching solution. Each through-hole 83 penetrate the silicon wafer 81, whereby etching of the silicon wafer 81 progresses in the direction parallel to the silicon oxide film 82 from the side surface of each through-hole 83 when the etching solution is supplied to each through-hole 83, as shown in FIG. 8C. When this etching progresses, the quadrangular annular region located between the peripheral edge portion and the central portion of the silicon wafer 81 is completely removed over the thickness direction, and the groove section 75 having the quadrangular annular shape in plan view is formed in the silicon wafer 81 as shown in FIG. 7. Consequently, the silicon oxide film 82 defines the membrane 71, and the silicon wafer 81 is divided into the support section 72 supporting the peripheral edge portion of the membrane 71 and the weight section 73 held on the central portion of the membrane 71 by the groove portion 75. Thus, the semiconductor device 70 shown in FIG. 7 is obtained.

According to this method of manufacturing a semiconductor device, as described hereinabove, the silicon oxide film 82 having resistance to the etching solution is formed on the silicon wafer 81 serving as an etching layer of interest. Thereafter, the plurality of through-holes 83 are formed in the silicon wafer 81 and the silicon oxide film 82 to penetrate the silicon wafer 81 and the silicon oxide film 82. Then, the etching solution for etching the silicon wafer 81 is supplied into the through-holes 83 from the side of the silicon oxide film 82. Thus, the silicon wafer 81 is etched through the silicon oxide film 82 serving as a mask, having the plurality of through-holes 83. This etching progresses in the direction parallel to the silicon oxide film 82 (direction intersecting with the laminating direction of the silicon wafer 81 and the silicon oxide film 82) from the side surfaces of each through-hole 83. When the pitch of the through-holes 83 (interval between the through-holes 83) and the positions thereof are decided in consideration of only the etching rate in the direction parallel to the silicon oxide film 82, the silicon wafer 81 can be patterned into a desired shape (shape of the groove section 75: quadrangular annular shape in plan view according to this embodiment) by communicating the plurality of through-holes 83 with one another in the silicon wafer 81. Thus, the labor for designing a mask for patterning the silicon wafer 81 can be reduced as compared with a conventional method.

While the silicon oxide film 82 is formed on the front surface of the silicon wafer 81 according to the third embodiment, a silicon nitride film may alternatively be formed by plasma treatment in place of the silicon oxide film 82. In this case, SiN (silicon nitride) is employed as the material for the membrane 71.

The groove section 75 is not limited to the quadrangular annular shape in plan view, but may alternatively have an annular shape in plan view, for example.

The aforementioned method of manufacturing a semiconductor device is not limited to the acceleration sensor, but is also applicable to various types of semiconductor devices such as a piezoresistance type semiconductor pressure sensor for detecting the pressure of a gas or the like, for example.

Fourth Embodiment

Figure 9A:
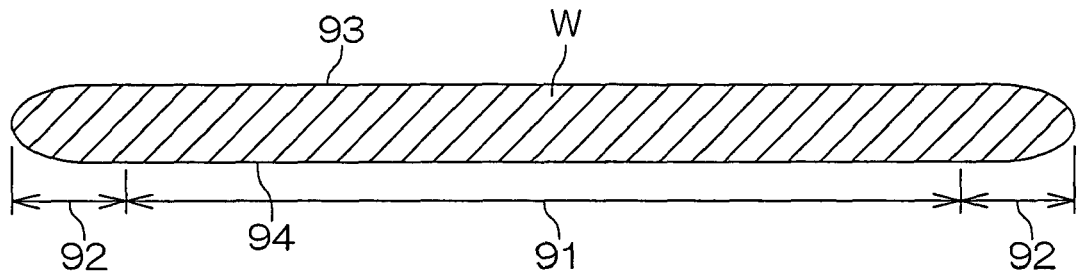
FIG. 9A is a schematic sectional view for illustrating a method of manufacturing a semiconductor device according to a fourth embodiment of the present invention.
Figure 9B:
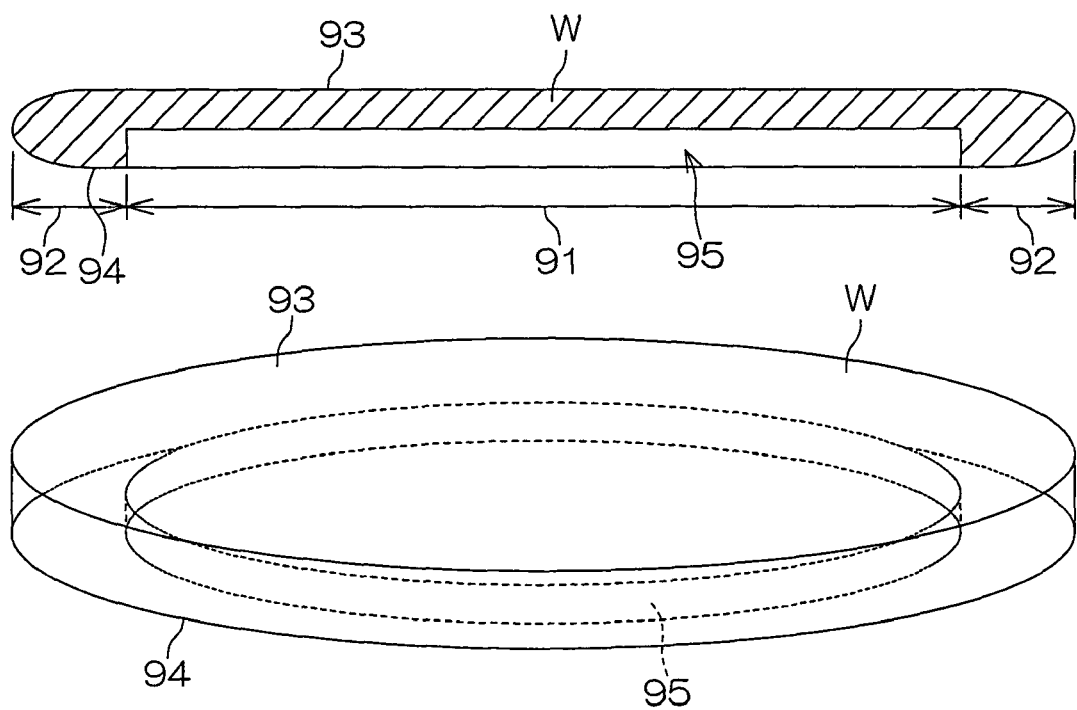
FIG. 9B illustrates a schematic sectional view and a schematic perspective view showing a step next to that shown in FIG. 9A.
Figure 9C:
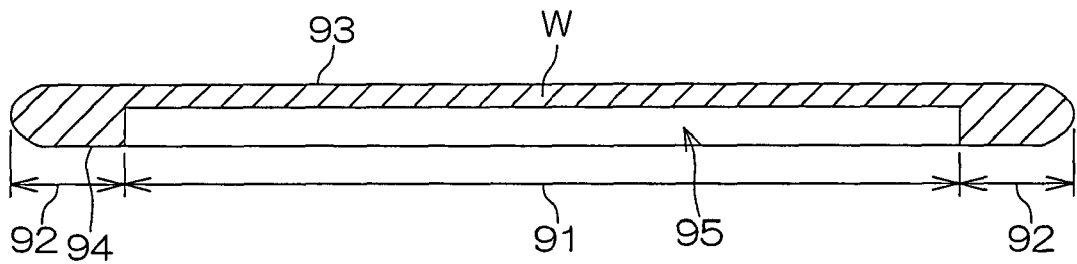
FIG. 9C is a schematic sectional view showing a step next to that shown in FIG. 9B.
Figure 10:
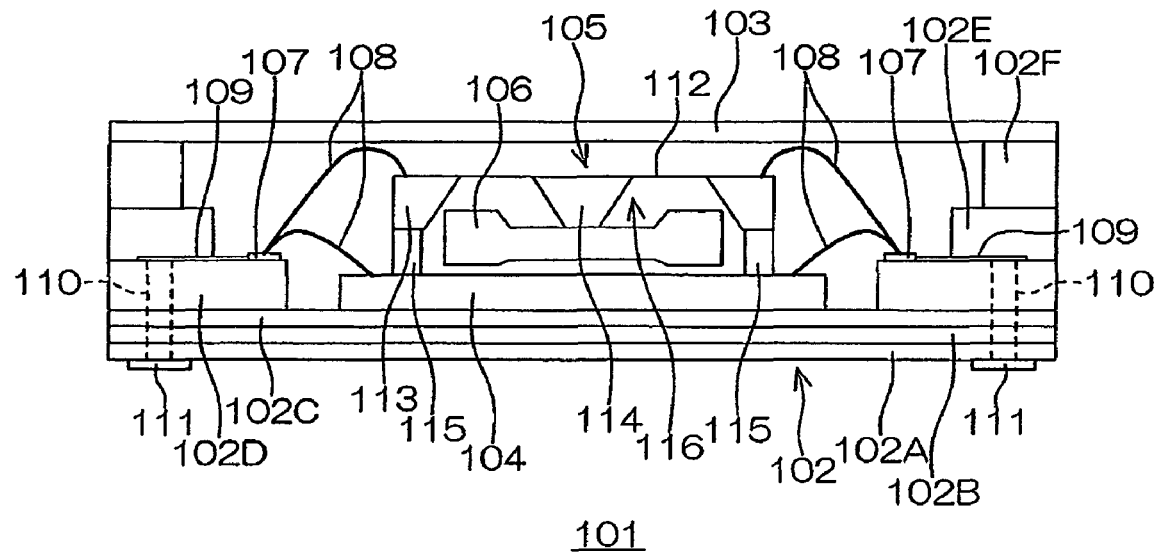
FIG. 10 is a sectional view schematically showing the structure of a conventional acceleration sensor.
Figure 11:
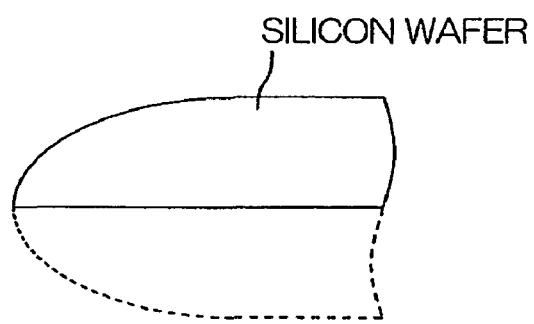
FIG. 11 is a schematic side elevational view showing the shape of an edge portion of a conventional thinned silicon wafer.

FIGS. 9A to 9C are schematic diagrams for illustrating a method of manufacturing a semiconductor device according to a fourth embodiment of the present invention.

According to the method of manufacturing a semiconductor device, a silicon wafer W is first prepared, as shown in FIG. 9A. In this silicon wafer W, a central section 91 is a region employed for manufacturing a semiconductor device, and an edge section 92 around the central section 91 is a region not employed for manufacturing the semiconductor device. In the central section 91 of the silicon wafer W, a device such as a transistor is formed on a surface layer portion closer to the front surface 93.

Then, a recess 95 shaped by entirely recessing a portion included in the central section 91 of the rear surface 94 opposite to the front surface 93 is formed on the rear surface 94 of the silicon wafer W, as shown in FIG. 9B. Thus, the central section 91 of the silicon wafer W is thinned to a thickness (400 μm) of about ⅔ of the original thickness (625 μm), for example (first wafer thinning step). The recess 95 may be formed either by grinding or by etching.

Thereafter an etching solution is supplied to the front surface 93 and the rear surface 94 of the silicon wafer W for etching the front surface 93 and the rear surface 94 of the silicon wafer W (second wafer thinning step). The etching progresses at the same rate on the front surface 93 and the rear surface 94 (including the recess 95) of the silicon wafer W. When the central section 91 of the silicon wafer W is thinned to a desired thickness (300 μm, for example), therefore, the edge section 92 of the silicon wafer W has a thickness larger than that of the central section 91 by the depth of the recess 95, as shown in FIG. 9C.

Thus, mechanical strength can be ensured on the edge section 92 of the silicon wafer W by leaving a relatively large thickness in the edge section 92 of the silicon wafer W, whereby the silicon wafer W can be prevented from edge chipping. Therefore, a semiconductor device can be manufactured using the thinned silicon wafer W without causing edge chipping when the silicon wafer W is handled.

While the illustrative embodiments of the present invention are described in detail, these are mere specific examples for clarifying the technical contents of the present invention and it is not to be construed limitative thereto. The spirit and the scope of the invention are only limited by the claims appended hereto.

This application claims priority of Japanese Patent Applications Nos. 2006-219610 and 2006-219611 filed on Aug. 11, 2006, Japanese Patent Applications Nos. 2006-333281 and 2006-333282 filed on Dec. 11, 2006 and Japanese Patent Application No. 2006-355713 filed on Dec. 28, 2006, the disclosures of which are herein incorporated by reference in their entirely.

What is claimed is:

1. An acceleration sensor comprising:
   a circuit chip having a prescribed circuit built into a front surface thereof;
   a sensor chip bonded to the front surface of the circuit chip; and
   a resin package for sealing the circuit chip and the sensor chip, the sensor chip comprising:
   a membrane arranged to oppose to the front surface of the circuit chip and having a plurality of openings;
   a piezoresistor formed on a surface of the membrane opposed to the circuit chip;
   a support section provided on a side opposite to the circuit chip with respect to the membrane and supporting a peripheral edge portion of the membrane;
   a weight section provided on the side opposite to the circuit chip with respect to the membrane and integrally held on a central portion of the membrane; and
   a lid member provided so as to close a space between the support section and the weight section from a side opposite to the membrane, wherein
   a surface of the lid member facing away from the circuit chip is covered with the resin package.

2. The acceleration sensor according to claim 1, further comprising a bump interposed between the circuit chip and the sensor chip and connecting the circuit chip and the sensor chip with each other at a prescribed interval.

3. The acceleration sensor according to claim 2, wherein the bump comprises:
   a circuit-chip-side bump projectingly formed on the front surface of the circuit chip with an Au material;
   a sensor-chip-side pad formed on the surface of the membrane opposed to the circuit chip with a Au material; and
   a connecting metal section formed of a Sn material for connecting the circuit-chip-side bump and the sensor-chip-side pad with each other.

4. The acceleration sensor according to claim 3, wherein a wire connected to the piezoresistor is formed on the surface of the membrane opposed to the circuit chip, and a part of the wire defines the sensor-chip-side pad connected to the circuit-chip-side bump.

5. The acceleration sensor according to claim 3, wherein the membrane is in a form of a mesh having a plurality of openings.

6. The acceleration sensor according to claim 1, further comprising a surface film provided between the front surface of the circuit chip and a surface of the membrane opposed to the circuit chip for regulating an amount of oscillation of the weight section in a direction in which the circuit chip and the sensor chip are opposed to each other.

7. The acceleration sensor according to claim 1, wherein the weight section is shaped such that a sectional area taken along a plane perpendicular to the direction opposed to the circuit chip and the sensor chip increases as separating from the membrane.

8. The acceleration sensor according to claim 1, wherein a surface of the weight section facing away from the circuit chip is in contact with the lid member.

9. The acceleration sensor according to claim 1, wherein a wire connected to the piezoresistor is formed on the surface of the membrane opposed to the circuit chip.

10. The acceleration sensor according to claim 9, wherein the wire is covered with a wire protective film.

11. A semiconductor device bonded to a front surface of a circuit chip having a prescribed circuit built thereinto and constituting an acceleration sensor with the circuit chip, the semiconductor device comprising:
    a membrane arranged to oppose to a front surface of the circuit chip and being in a form of a mesh having a plurality of openings;
    a piezoresistor formed on a surface of the membrane opposed to the circuit chip;
    a support section provided on a side opposite to the circuit chip with respect to the membrane and supporting a peripheral edge portion of the membrane; and
    a weight section provided on the side opposite to the circuit chip with respect to the membrane and integrally held on a central portion of the membrane; wherein
    the weight section is shaped such that a sectional area taken along a plane perpendicular to a direction in which the weight section is opposed to the circuit chip increases as separating from the membrane.

12. The semiconductor device according to claim 11, further comprising a surface film provided between the front surface of the circuit chip and a surface of the membrane opposed to the circuit chip for regulating an amount of oscillation of the weight section in the direction in which the weight section is opposed to the circuit chip.

13. The semiconductor device according to claim 11, wherein
    a wire connected to the piezoresistor is formed on the surface of the membrane opposed to the circuit chip.

14. The semiconductor device according to claim 13, wherein
    the wire is covered with a wire protective film.

15. The semiconductor device according to claim 13, further comprising:
    a circuit-chip-side bump projectingly formed on the front surface of the circuit chip with an Au material;
    a sensor-chip-side pad connected to the circuit-chip-side bump and formed with a part of the wire; and
    a connecting metal section formed of an Sn material for connecting the circuit-chip-side bump and the sensor-chip-side pad with each other.

* * * * *